(12) United States Patent
Ito

(10) Patent No.: US 9,750,130 B2
(45) Date of Patent: Aug. 29, 2017

(54) PRINTED WIRING BOARD, INFORMATION COMMUNICATION DEVICE, AND DISPLAY SYSTEM

(71) Applicant: SEIKO EPSON CORPORATION, Tokyo (JP)

(72) Inventor: Masaaki Ito, Ina (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/388,475

(22) Filed: Dec. 22, 2016

(65) Prior Publication Data

US 2017/0208681 A1 Jul. 20, 2017

(30) Foreign Application Priority Data

Jan. 20, 2016 (JP) ................... 2016-008501

(51) Int. Cl.
*H05K 1/02* (2006.01)
*H04N 9/31* (2006.01)
*H04N 5/38* (2006.01)

(52) U.S. Cl.
CPC ............ *H05K 1/0245* (2013.01); *H04N 5/38* (2013.01); *H04N 9/3141* (2013.01)

(58) Field of Classification Search
CPC ....... H05K 1/0245; H04N 5/38; H04N 9/3141
USPC ........ 439/55; 174/250, 260; 333/12, 1, 24 R
See application file for complete search history.

(56) References Cited

U.S. PATENT DOCUMENTS

| 7,518,462 | B2 | 4/2009 | Kanno et al. |
|---|---|---|---|
| 9,024,196 | B2 | 5/2015 | Yoneya et al. |
| 2006/0231287 | A1 | 10/2006 | Nakayama |
| 2007/0040627 | A1 | 2/2007 | Kanno et al. |
| 2011/0203834 | A1 | 8/2011 | Yoneya et al. |

FOREIGN PATENT DOCUMENTS

| JP | 2003-249760 A | 9/2003 |
|---|---|---|
| JP | 2003-258394 A | 9/2003 |
| JP | 2006-278847 A | 10/2006 |
| JP | 2011-176151 A | 9/2011 |
| JP | 2011-210760 A | 10/2011 |
| WO | 2006/106767 A1 | 10/2006 |

*Primary Examiner* — Alexander Gilman
(74) *Attorney, Agent, or Firm* — Oliff PLC

(57) ABSTRACT

A printed wiring board includes a differential transmission line having a first wiring and a second wiring. The first wiring has a plurality of first linear portions formed of linear wiring and extending in a first direction, and a first bypass portion that is connected to the plurality of first linear portions and includes a linear wiring. The second wiring has a plurality of second linear portions formed of linear wirings and extending in a second direction substantially parallel to the first direction, and a second bypass portion that is connected to the plurality of second linear portions and includes a curved wiring. The first bypass portion and the second bypass portion protrude on the same side. A region in which the first bypass portion is provided and a region in which the second bypass portion is provided are at least partially overlapped in the first direction.

15 Claims, 4 Drawing Sheets

PRINTED WIRING BOARD, INFORMATION COMMUNICATION DEVICE, AND DISPLAY SYSTEM

BACKGROUND

1. Technical Field

The present invention relates to a printed wiring board, an information communication device, and a display system.

2. Related Art

In the related art, a display system of a type for transmitting data to a display device such as a projector by an information communication device using wireless communication is known. Recent information communication device has progressed faster and a differential transmission for transmitting data is often used by a pair of signal lines in a printed wiring board within the information communication device. The reason is that the differential transmission can reduce amplitude of a signal compared to a case of a single-ended transmission and thereby a transmission rate of the data can be increased. However, in order to correctly transmit a signal (data) in the differential transmission, it is important to align wiring lengths of a pair of signal lines from an input terminal to an output terminal of the signal to be equal to each other. A technique for equalizing wiring lengths of a pair of signal lines in a printed wiring board including a differential transmission line is disclosed in JP-A-2011-210760 and JP-A-2011-176151.

In a case of the differential transmission line described in JP-A-2011-210760 and JP-A-2011-176151, wiring intervals of the pair of signal lines are different depending on locations in portions in which bending portions are provided in the signal lines. In a region in which the wiring intervals are different, a characteristic impedance varies with respect to a region in which the wiring intervals are constant. Therefore, there is a great concern that signal quality is deteriorated due to the variation of the characteristic impedance. In addition, in the differential transmission line described in JP-A-2011-210760 and JP-A-2011-176151, there is a concern that a design problem in which a degree of freedom in design of the signal line is limited, an area occupied by the differential transmission line is increased, and the like occurs.

SUMMARY

An advantage of some aspects of the invention is to provide a printed wiring board which can suppress deterioration of signal quality. Another advantage of some aspects of the invention is to provide a printed wiring board which can solve a design problem of a differential transmission line. Still another advantage of some aspects of the invention is to provide an information communication device including the printed wiring board described above. Yet another advantage of some aspects of the invention is to provide a display system including the information communication device described above.

A printed wiring board according to an aspect of the invention includes a differential transmission line that has a first wiring and a second wiring. The first wiring has a plurality of first linear portions that are formed of a linear wiring and a first bypass portion that is connected to the plurality of first linear portions and includes a linear wiring extending in a direction intersecting a first direction in which the first linear portions extend. The second wiring has a plurality of second linear portions that are formed of a linear wiring and a second bypass portion that is connected to the plurality of second linear portions and includes a curved wiring extending in a direction intersecting a second direction in which the second linear portions extend. The first direction and the second direction are substantially parallel. The first bypass portion and the second bypass portion protrude on the same side with respect to the first linear portions and the second linear portions. A region in which the first bypass portion is provided and a region in which the second bypass portion is provided are at least partially overlapped in the first direction and the second direction.

In the printed wiring board of the aspect of the invention, the first wiring among two wirings configuring the differential transmission line includes the first bypass portion including the linear wiring and the second wiring includes the second bypass portion including the curved wiring. Therefore, it is possible to cause a wiring length of the second bypass portion to be longer than a wiring length of the first bypass portion. Therefore, for example, in a case where the wiring length of the first wiring of a portion excluding the first bypass portion is longer than the wiring length of the second wiring of a portion excluding the second bypass portion, it is possible to align an entire wiring length of the first wiring and an entire wiring length of the second wiring to be equal. In addition, the first bypass portion and the second bypass portion protrude on the same side with respect to the first linear portions and the second linear portions. The region in which the first bypass portion is provided and the region in which the second bypass portion is provided are at least partially overlapped in the first direction and the second direction. Therefore, it is possible to extremely reduce variation of the interval between the wirings configuring each of the first bypass portion and the second bypass portion. Therefore, it is possible to suppress variation of a characteristic impedance and to suppress deterioration of signal quality.

In the printed wiring board of the aspect of the invention, the first bypass portion may have a third linear portion that is formed of a linear wiring extending in a direction substantially parallel to the first direction, a fourth linear portion that connects one end of the third linear portion and one first linear portion, and is formed of a linear wiring extending in a direction intersecting the first direction, and a fifth linear portion that connects the other end of the third linear portion and another first linear portion, and is formed of a linear wiring extending in a direction intersecting the first direction.

In this configuration, the first bypass portion is configured of the third linear portion, the fourth linear portion, and the fifth linear portion, that is, three linear wirings. Therefore, it is possible to increase a difference between a wiring length of the second bypass portion including the curved wiring and a wiring length of the first bypass portion.

In the printed wiring board of the aspect of the invention, an angle between the first linear portion and the fourth linear portion, and an angle between the first linear portion and the fifth linear portion may be equal to or greater than 120° and equal to or less than 150°.

In this configuration, it is possible to effectively suppress the variation of the characteristic impedance while suppressing an increase in an area occupied by the bypass portions.

In the printed wiring board of the aspect of the invention, the second bypass portion may have a sixth linear portion that is formed of a linear wiring extending in a direction substantially parallel to the second direction, a first curved portion that connects one end of the sixth linear portion and one second linear portion, and is formed of a curved wiring extending in a direction intersecting the second direction, and a second curved portion that connects the other end of the sixth linear portion and another second linear portion, and is formed of a curved wiring extending in a direction intersecting the second direction.

In this configuration, the sixth linear portion of the second bypass portion and the third linear portion of the first bypass portion are disposed substantially parallel. Therefore, the variation of the interval between the wirings configuring each of the first bypass portion and the second bypass portion is further reduced. Therefore, it is possible to effectively suppress the variation of the characteristic impedance.

In the printed wiring board of the aspect of the invention, a first ratio of a distance from a center line of the first linear portion to a center line of the third linear portion with respect to a wiring width of the first linear portion may be equal to or greater than 0.5 and equal to or less than 1.0.

In this configuration, it is possible to effectively suppress the variation of the characteristic impedance while suppressing an increase in an area occupied by the bypass portions.

In the printed wiring board of the aspect of the invention, a second ratio of a distance from a center line of the second linear portion to a center line of the sixth linear portion with respect to a wiring width of the second linear portion may be equal to or greater than 0.5 and equal to or less than 1.0.

In this configuration, it is possible to effectively suppress the variation of the characteristic impedance while suppressing an increase in an area occupied by the bypass portions.

In the printed wiring board of the aspect of the invention, the first ratio and the second ratio may be substantially equal to each other.

In this configuration, it is possible to effectively suppress the variation of the characteristic impedance while suppressing an increase in an area occupied by the bypass portions.

An information communication device according to another aspect of the invention includes the printed wiring board according to the aspect of the invention.

In this configuration, it is possible to provide the information communication device which is excellent in signal quality.

A display system according to still another aspect of the invention includes an information transfer device configured to transfer video information; and a projector configured to project light based on the video information transferred by the information transfer device. At least one of the information transfer device and the projector includes a print wiring board that has a differential transmission line having a first wiring and a second wiring. The first wiring has a plurality of first linear portions that are formed of a linear wiring and a first bypass portion that is connected to the plurality of first linear portions and includes a linear wiring extending in a direction intersecting a first direction in which the first linear portions extend. The second wiring has a plurality of second linear portions that are formed of a linear wiring and a second bypass portion that is connected to the plurality of second linear portions and includes a curved wiring extending in a direction intersecting a second direction in which the second linear portions extend. The first direction and the second direction are substantially parallel. The first bypass portion and the second bypass portion protrude on the same side with respect to the first linear portions and the second linear portions. A region in which the first bypass portion is provided and a region in which the second bypass portion is provided are at least partially overlapped in the first direction and the second direction.

In this configuration, deterioration of quality of video information is suppressed. Therefore, it is possible to provide the display system which is excellent in video quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to FIGS. 1 to 5.

A display system of the embodiment is an example of a display system including a projector as a display device.

Moreover, in order to easily recognize each configuration element in each figure described below, the configuration element is indicated with different scale size.

Figure 1:
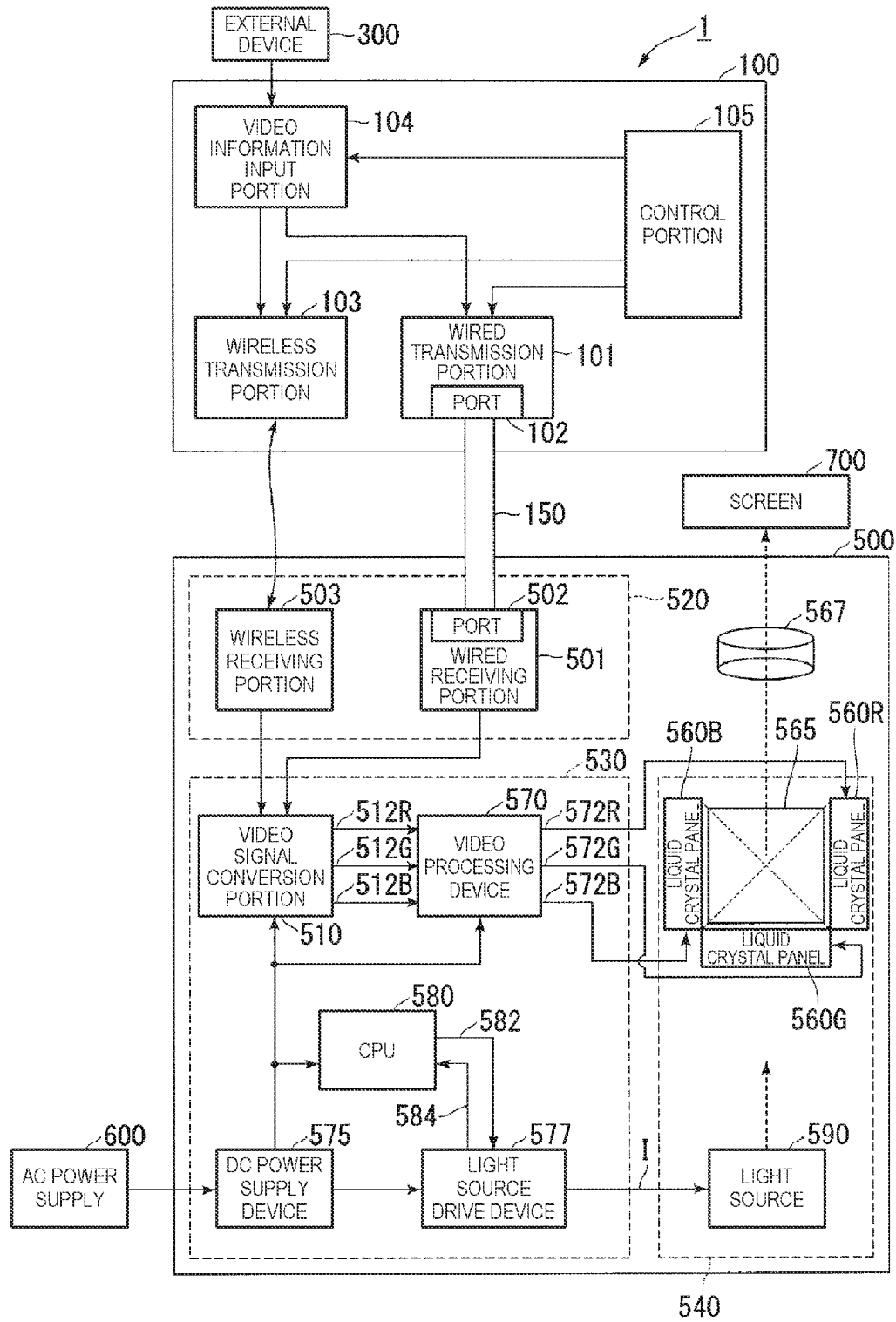
FIG. 1 is a schematic configuration diagram of a display system of an embodiment of the invention.

FIG. 1 illustrates a configuration of a display system 1 of the embodiment.

As illustrated in FIG. 1, the display system 1 includes an information transfer device 100 and a projector 500. The display system 1 transmits a video signal that is output from an external device 300 using the information transfer device 100 corresponding to Wireless HD (registered trade mark) communication, the video signal is received in the projector 500 including a receiver corresponding to the Wireless HD communication, and a video based on the video signal is projected on a screen.

In the embodiment, the information transfer device 100 as a transmitter that transmits video information and the projector 500 as the receiver that receives the video information correspond to the information communication device in the appended claims. In addition, in the embodiment, the video information includes video data, audio data, a synchronization signal, and the like.

The external device 300 is connected to the information transfer device 100. The external device 300 supplies the video information to the display system 1. More specifically, the external device 300 outputs the video information to a video information input portion 104 of the information transfer device 100.

The information transfer device 100 includes a wired transmission portion 101 including a port 102, a wireless transmission portion 103, the video information input portion 104, and a control portion 105.

The video information of various types is input into the video information input portion 104 from the external device 300. The video information input portion 104 outputs the input video information to the wired transmission portion 101 or the wireless transmission portion 103 in accordance with the control of the control portion 105.

The wired transmission portion 101 has the port 102 that is connected to a display device such as the projector 500 via a cable 150. If the connection of the display device to the port 102 is detected, the wired transmission portion 101 notifies the control portion 105 of the effect thereof. The cable 150 is a cable corresponding to, for example, High-Definition Multimedia Interface (HDMI: registered trade mark) and transfers data such as the video data, the audio data, the synchronization signal, and a Consumer Electronics Control Line (CEC) command. The wired transmission portion 101 transmits video information that is output from the video information input portion 104 to the projector 500 via the cable 150 according to the control of the control portion 105.

The wireless transmission portion 103 is controlled by the control portion 105 and performs wireless communication of the video information and the like with the projector 500. The wireless transmission portion 103 transmits the video information that is output from the video information input portion 104 to the projector 500 that is wireless connected in accordance with the control of the control portion 105. The wireless transmission portion 103 includes a printed wiring board 10 described below.

The control portion 105 selects the wired transmission portion 101 or the wireless transmission portion 103 as a transfer unit that transmits the video information to the projector 500 in accordance with an operation input of a user which is accepted by an operation portion (not illustrated) or control that is predetermined, for example, the wireless communication priority is given in a case where wireless communication is executed, and the like.

The projector 500 includes an optical portion 540, a circuit portion 530, and a receiving portion 520.

The optical portion 540 includes alight source 590, three liquid crystal light valves (light modulation devices) 560R, 560G, and 560B, a cross dichroic prism 565, and a projection optical system 567.

The light source 590 emits a white light. An illumination of the light projected from the light source 590 is made uniform on the liquid crystal light valves 560R, 560G, and 560B by a lighting optical system (not illustrated) and a polarization direction thereof is adjusted. In the embodiment, the light source 590 includes various light source devices such as a discharge lamp including a high-voltage discharge lamp and the like, a semiconductor laser, or a light emitting diode (LED). In addition, in the embodiment, the light source 590 emits the white light, but is not limited to the example. The light source 590 may be configured of alight source device includes one or more light emitting element that emits a predetermined color light other than the white light and a phosphor that converts an incident light into a predetermined color light. In this case, a color separation optical system (not illustrated) described below may be omitted.

The light emitted from the lighting optical system is separated by a color separation optical system (not illustrated) into three colors of red light (R), green light (G), and blue light (B). The three color lights are respectively modulated by the liquid crystal light valves 560R, 560G, and 560B corresponding to each color light in accordance with video signals 572R, 572G, and 572B. The liquid crystal light valves 560R, 560G, and 560B respectively include a liquid crystal panel and a polarizing plate. The polarizing plates are disposed on a light incident side and a light emitting side of the liquid crystal panel.

The modulated three color lights are synthesized by the cross dichroic prism 565. The synthesized light is incident on the projection optical system 567. The projection optical system 567 projects the incident light to a screen 700. Therefore, a video is displayed on the screen 700.

The circuit portion 530 includes a video signal conversion portion 510, a DC power supply device 575, a video processing device 570, a Central Processing Unit (CPU) 580, and a light source drive device 577.

The video signal conversion portion 510 converts the video signal (luminance-color difference signal, an analog RGB side, and the like) input from the outside into a digital RGB signal, generates video signals 512R, 512G, and 512B, and supplies the video signals 512R, 512G, and 512B to the video processing device 570.

The video processing device 570 performs video processing with respect to the three video signals 512R, 512G, and 512B respectively. The video processing device 570 supplies the video signals 572R, 572G, and 572B for driving the liquid crystal light valves 560R, 560G, and 560B respectively to the liquid crystal light valves 560R, 560G, and 560B.

The DC power supply device 575 converts an AC voltage supplied from an AC power supply 600 of the outside into a constant DC voltage. The DC power supply device 575 supplies the DC voltage to the video signal conversion portion 510, the video processing device 570, and the light source drive device 577.

The light source drive device 577 supplies a drive current to the light source 590 during actuation and turns on the light source 590.

The liquid crystal light valves 560R, 560G, and 560B modulate a transmittance (luminance) of the color light incident on each of the liquid crystal light valves 560R, 560G, and 560B via the optical system described above based on each the video signals 572R, 572G, and 572B.

The CPU 580 controls various operations from a start of turning on to turning off of the projector 500. For example, the CPU 580 outputs a turning-on command or a turning-off command to the light source drive device 577 via a communication signal 582. The CPU 580 receives turning-on information of the light source 590 from the light source drive device 577 via a communication signal 584.

The receiving portion 520 includes a wired receiving portion 501 and a wireless receiving portion 503. In the embodiment, the wired receiving portion 501 and the wireless receiving portion 503 are connected to the CPU 580 as a control portion described below by a control signal line and the control signal line is omitted in FIG. 1.

The wired receiving portion 501 includes a port 502 that is connected to the information transfer device 100 via the cable 150. If the connection of the information transfer device 100 to the port 502 is detected, the wired receiving portion 501 notifies the CPU 580 of the effect thereof. In addition, in a case where the wired receiving portion 501 receives the video information from the information transfer device 100 via the cable 150, the wired receiving portion 501 outputs the received video information to the video signal conversion portion 510 according to the control of the CPU 580.

The wireless receiving portion 503 is controlled by the CPU 580 and performs wireless communication of the video information and the like with the wireless transmission port ion 103 of the information transfer device 100. In a case where the wireless receiving portion 503 receives the video information from the information transfer device 100 using wireless communication with the information transfer device 100, the wireless receiving portion 503 outputs the received video information to the video signal conversion portion 510 in accordance with the control of the CPU 580. The wireless receiving portion 503 includes the printed wiring board 10 which is described below.

The printed wiring board 10 of the embodiment is used for the wireless transmission portion 103 of the information transfer device 100 and the wireless receiving portion 503 of the projector 500 illustrated in FIG. 1.

Figure 2:
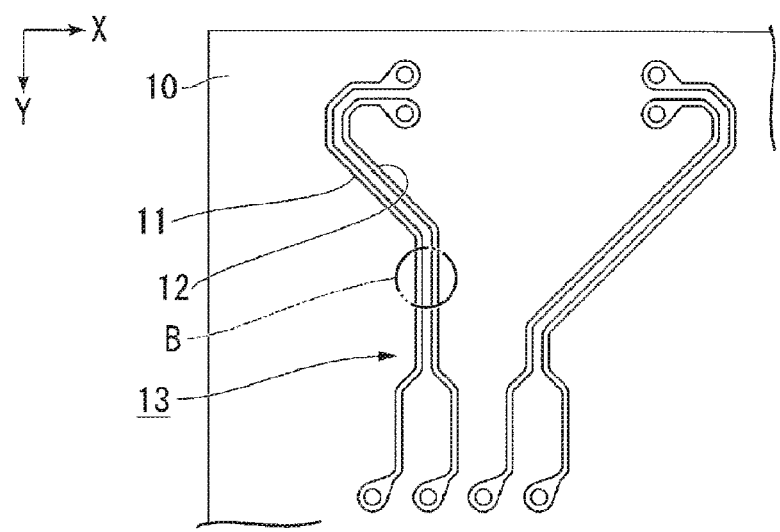
FIG. 2 is a plan view of a printed wiring board of an embodiment of the invention.

FIG. 2 illustrates a configuration of the printed wiring board 10 in the embodiment.

As illustrated in FIG. 2, the printed wiring board 10 includes a differential transmission line 13 having a first wiring 11 and a second wiring 12. Among a pair of wirings configuring the differential transmission line 13, a left wiring is the first wiring 11 and a right wiring is the second wiring 12. The first wiring 11 and the second wiring 12 are wired such that a wiring path from an input end to an output end is not straight but is bent entirely in accordance with a specification of the printed wiring board 10. As described below, a first bypass portion 16 (see FIG. 3) is provided in the first wiring 11 and a second bypass portion 19 (see FIG. 3) is provided in the second wiring 12. Therefore, a wiring length from the input end to the output end of the first wiring 11 and a wiring length from the input end to the output end of the second wiring 12 are substantially equal.

Figure 3:
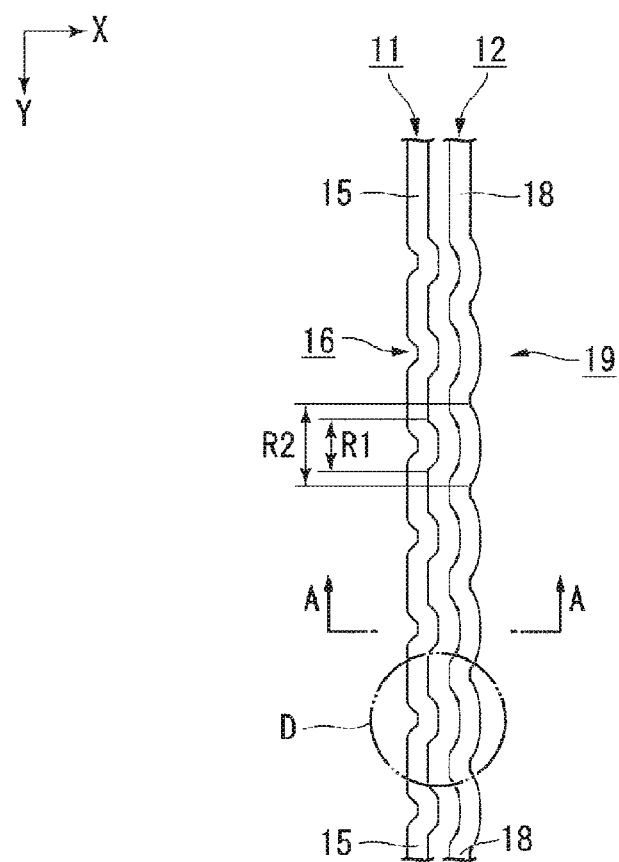
FIG. 3 is an enlarged view of a region III of FIG. 2.

FIG. 3 illustrates an enlarged view in a region III of the differential transmission line 13 in the printed wiring board 10 which is indicated in FIG. 2.

As illustrated in FIG. 3, the first wiring 11 includes a plurality of first linear portions 15 that are formed of a linear wiring and a plurality of first bypass portions 16 that are connected to the plurality of first linear portions 15. The second wiring 12 includes a plurality of second linear portions 18 that are formed of a linear wiring and a plurality of second bypass portions 19 that are connected to the plurality of second linear portions 18. Each first bypass portion 16 includes a linear wiring extending in a direction intersecting a first direction (Y direction in FIG. 3) in which each first linear portion 15 extends and protrudes on one side (+X direction in FIG. 3) with respect to the first linear portion 15. Each second bypass portion 19 includes a curved wiring extending in a direction intersecting a second direction (Y direction in FIG. 3) in which each second linear portion 18 extends and protrudes on one side (+X direction in FIG. 3) with respect to the second linear portion 18. Therefore, the first bypass portion 16 and the second bypass portion 19 protrude on the same side with respect to the first linear portion 15 and the second linear portion 18.

A region R1 in which one first bypass portion 16 is provided and a region R2 in which one second bypass portion 19 is provided are at least partially overlapped in the first direction and the second direction. In other words, the region R1 in which the first bypass portion is provided and the region R2 in which the second bypass portion is provided are at least partially overlapped when viewed from a direction intersecting the direction in which the first linear portion 15 or the second linear portion 18 extends. In the embodiment, the region R1 in which the first bypass portion 16 is provided is positioned within a range of the region R2 in which the second bypass portion 19 is provided. In addition, the number of the first bypass portions 16 and the number of the second bypass portions 19 may be appropriately changed in accordance with a design, but it is preferable that the number of the first bypass portions 16 and the number of the second bypass portions 19 are equal to each other. In addition, in the embodiment, the first wiring 11 and the second wiring 12 are wired substantially parallel in the printed wiring board 10. That is, the first direction in which each first linear portion 15 extends and the second direction in which each second linear portion 18 extends are substantially parallel.

Figure 4:
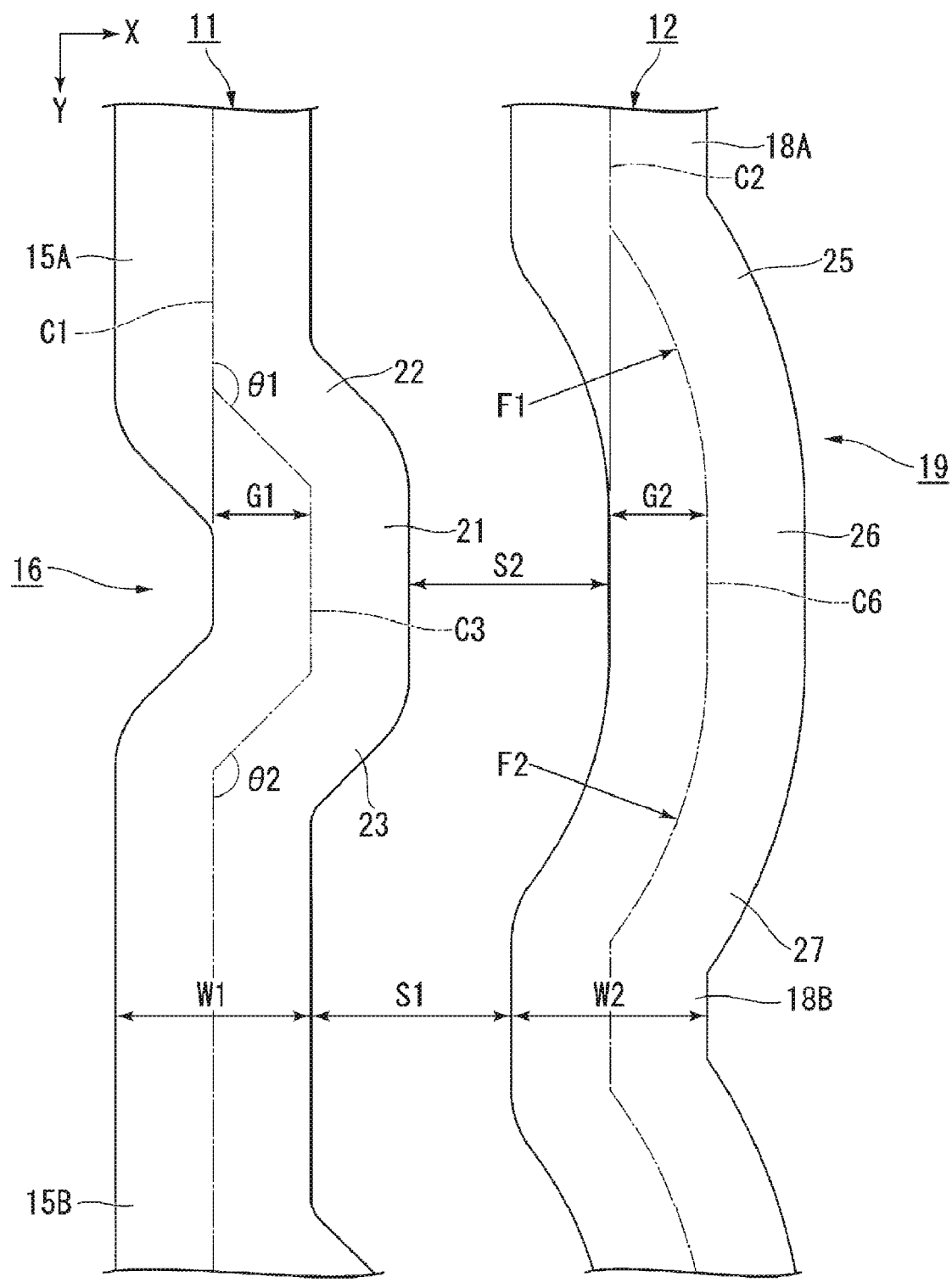
FIG. 4 is an enlarged view of a region IV of FIG. 3.

FIG. 4 illustrates an enlarged view in a region IV of the differential transmission line 13 which is indicated in FIG. 3.

As illustrated in FIG. 4, the first wiring 11 includes first linear portions 15A and 15B, and the first bypass portion 16. The second wiring 12 includes second linear portions 18A and 18B, and the second bypass portion 19. The first bypass portion 16 includes a third linear portion 21, a fourth linear portion 22, and a fifth linear portion 23. The third linear portion 21 is configured of a linear wiring extending in a direction substantially parallel to the first direction in which the first linear portions 15A and 15B extend. The fourth linear portion 22 connects one end of the third linear portion 21 and the first linear portion 15A, and is configured of a linear wiring extending in a direction intersecting the first direction. The fifth linear portion 23 connects the other end of the third linear portion 21 and the first linear portion 15B, and is configured of a linear wiring extending in a direction intersecting the first direction.

In the embodiment, an angle $\theta 1$ between the first linear portion 15A and the fourth linear portion 22, and an angle $\theta 2$ between the first linear portion 15B and the fifth linear portion 23 are both 135°. The angle $\theta 1$ between the first linear portion 15A and the fourth linear portion 22, and the angle $\theta 2$ between the first linear portion 15B and the fifth linear portion 23 may not be necessarily 135°, but are preferable to be equal to or greater than 120° and equal to or less than 150°. The angle $\theta 1$ between the first linear portion 15A and the fourth linear portion 22, and the angle $\theta 2$ between the first linear portion 15B and the fifth linear portion 23 may not be matched.

A center line C3 of the third linear portion 21 is shifted from an extension line of a center line C1 of the first linear portions 15A and 15B in the +X direction. A wiring width of the first linear portions 15A and 15B is W1 and a distance from the center line C1 of the first linear portions 15A and 15B to the center line C3 of the third linear portion 21 in the X direction is G1. In the embodiment, a ratio G1/W1 (first ratio) of the distance G1 with respect to the wiring width W1 is 0.5. That is, the third linear portion 21 is shifted by a distance of ½ of the wiring width W1 of the first linear portions 15A and 15B from the extension line of the centerline C1 of the first linear portions 15A and 15B in the X direction.

The second bypass portion 19 includes a first curved portion 25, a sixth linear portion 26, and a second curved portion 27. The sixth linear portion 26 is configured of a linear wiring extending in a direction substantially parallel to the second direction in which the second linear portions 18A and 18B extend. The first curved portion 25 connects one end of the sixth linear portion 26 and the second linear portion 18A, and is configured of a curved wiring extending in a direction intersecting the second direction. The second curved portion 27 connects the other end of the sixth linear portion 26 and the second linear portion 18B, and is configured of a curved wiring extending in a direction intersecting the second direction.

In the embodiment, the first linear portions 15A and 15B in the first wiring 11 are disposed at positions corresponding to the second linear portions 18A and 18B in the second wiring 12 in the Y direction. The third linear portion of the first wiring 11 is disposed at a position corresponding to the sixth linear portion 26 in the second wiring 12 in the Y direction. The fourth linear portion 22 is disposed at a position corresponding to the first curved portion 25 in the second wiring 12 in the Y direction. The fifth linear portion 23 is disposed at a position corresponding to the second curved portion 27 in the second wiring 12 in the Y direction.

A center line C6 of the sixth linear portion 26 is shifted from the extension line of a center line C2 of the second linear portions 18A and 18B in the +X direction. A wiring width of the second linear portions 18A and 18B is W2 and a distance from the center line C2 of the second linear portions 18A and 18B to the center line C6 of the sixth linear portion 26 in the X direction is G2. In the embodiment, a ratio G2/W2 (second ratio) of the distance G2 with respect to the wiring width W2 is 0.5. That is, the sixth linear portion 26 is shifted by a distance of ½ of the wiring width W1 of the second linear portions 18A and 18B from the extension line of the center line C2 of the second linear portions 18A and 18B in the X direction.

It is preferable that the first ratio G1/W1 is equal to or greater than 0.5 and equal to or less than 1.0. If the first ratio G1/W1 is less than 0.5, a difference between the wiring lengths of the first bypass portion 16 and the second bypass portion 19 is too small and it is difficult to cause the wiring lengths of the first wiring 11 and the second wiring 12 to be same. If the first ratio G1/W1 is greater than 1.0, an area occupied by the first bypass portion 16 on the printed wiring board 10 is too large and it is difficult to design the differential transmission line 13.

Similarly, it is preferable that the second ratio G2/W2 is equal to or greater than 0.5 and equal to or less than 1.0. If the second ratio G2/W2 is less than 0.5, a difference between the wiring lengths of the first bypass portion 16 and the second bypass portion 19 is too small and it is difficult to cause the wiring lengths of the first wiring 11 and the second wiring 12 to be same. If the second ratio G2/W2 is greater than 1.0, an area occupied by the second bypass portion 19 on the printed wiring board 10 is too large and it is difficult to design the differential transmission line 13. In the embodiment, it is preferable that the first ratio G1/W1 and the second ratio G2/W2 are substantially equal.

In the embodiment, when indicating an example of dimensions of each portion, the wiring width W1 of the first linear portions 15A and 15B is approximately 100 μm. The wiring width W2 of the second linear portions 18A and 18B is approximately 100 μm. An interval S1 between the first linear portions 15A and 15B, and the second linear portions 18A and 18B in the X direction is approximately 100 μm. An interval S2 between the third linear portion 21 and the sixth linear portion 26 in the X direction is approximately 100 μm. A curvature radius F1 of the first curved portion 25 is approximately 200 μm. A curvature radius F2 of the second curved portion 27 is approximately 200 μm. However, these dimensions are an example and may be appropriately changed.

Figure 5:
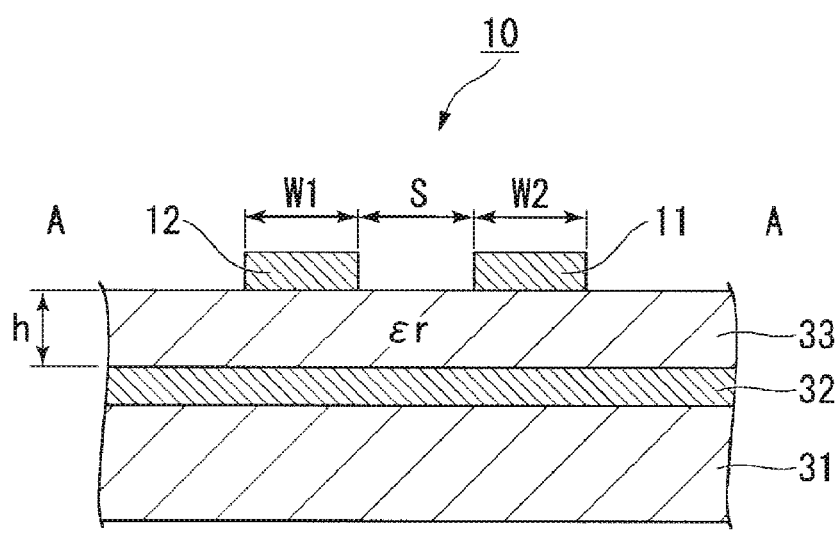
FIG. 5 is a sectional view that is taken along line A-A of FIG. 3.

FIG. 5 is a sectional view that is taken along line A-A in FIG. 3 in the differential transmission line 13.

As illustrated in FIG. 5, the printed wiring board 10 is configured of a laminated body in which a ground layer 32, a dielectric layer 33, the first wiring 11, and the second wiring 12 are sequentially laminated on an upper surface of a substrate 31. As a configuration material of the printed wiring board 10, it is possible to use a general material.

In the differential transmission line 13 of the embodiment, if the bypass portions 16 and 19 are not provided in each of a pair of wirings, the wiring length from the input end to the output end of the first wiring 11 is longer than the wiring length from the input end to the output end of the second wiring 12. Therefore, in order to align the wiring lengths from the input ends to the output ends of the first wiring 11 and the second wiring 12, the plurality of first bypass portions 16 formed of the linear portions are provided in the first wiring 11 and the plurality of second bypass portions 19 including curved portions are provided in the second wiring 12.

That is, in a case where arbitrary two points on a plane are connected by a wiring, a wiring length of a case where the connection is performed by a curved wiring is longer than a wiring length of a case where the connection is performed by a linear wiring. Therefore, the wiring length of the second bypass portion 19 including the curved portion is longer than the wiring length of the first bypass portion 16 formed of the linear portion.

Given that the number of the first bypass portions 16 is equal to the number of the second bypass portions 19, the number of the first bypass portion 16 and the second bypass portion 19 is n and a difference between the wiring length of one first bypass portion 16 and the wiring length of one second bypass portion 19 is Δt. In this case, when looking at the whole of the first wiring 11 and the second wiring 12, the first bypass portion 16 and the second bypass portion 19 are provided and thereby the wiring length of the second wiring 12 is longer than the wiring length of the first wiring 11 by Δt×n. In a case where the first bypass portion 16 and the second bypass portion 19 are not provided, when the difference between the wiring length of the first wiring 11 and the wiring length of the second wiring 12 is ΔT, if each wiring is designed such that ΔT=Δt×n, it is possible to align the wiring length from the input ends to the output ends of both wirings.

The characteristic impedance of the differential transmission line 13 is determined by a relative dielectric constant ∈r of the dielectric layer 33, a thickness h of the dielectric layer 33, the wiring width W1 of the first wiring 11, the wiring width W2 of the second wiring 12, and the interval S between the first wiring 11 and the second wiring 12 illustrated in FIG. 5. If the relative dielectric constant ∈r of the dielectric layer 33 and the thickness h of the dielectric layer 33 are constant in accordance with the specification of the printed wiring board 10, and the wiring width W1 of the first wiring 11 and the wiring width W2 of the second wiring 12 are designed to be constant, a value of the characteristic impedance varies in accordance with the interval S between the first wiring 11 and the second wiring 12. Therefore, in order to cause the characteristic impedance to be constant over the whole of the differential transmission line 13, it is important to keep the interval S between the first wiring 11 and the second wiring 12 to be constant.

The printed wiring board 10 of the embodiment includes the differential transmission line 13 having the first wiring 11 and the second wiring 12. The first wiring 11 includes the plurality of first linear portions 15A and 15B formed of the linear wirings, and the first bypass portion 16 that is connected to the plurality of first linear portions 15A and 15B, and includes the linear wirings extending in a direction intersecting the first direction in which the first linear portions 15A and 15B extend. The second wiring 12 includes the plurality of second linear portions 18A and 18B formed of the linear wirings, and the second bypass portion 19 that is connected to the plurality of second linear portions 18A and 18B, and includes the curved wiring extending in a direction intersecting the second direction in which the second linear portions 18A and 18B extend. The first direction and the second direction are substantially parallel. The first bypass portion 16 and the second bypass portion 19 protrude on the same side with respect to the first linear portions 15A and 15B, and the second linear portions 18A and 18B. The region R1 in which the first bypass portion 16 is provided and the region R2 in which the second bypass portion 19 is provided are at least partially overlapped in the first direction and the second direction.

As described above, the wiring lengths of the first wiring 11 and the second wiring 12 are substantially equal by using the first bypass portion 16 formed of the linear portion and the second bypass portion 19 including the curved portion.

The first direction in which the first linear portions 15A and 15B extend and the second direction in which the second linear portions 18A and 18B extend are substantially parallel. The first bypass portion 16 and the second bypass portion 19 respectively protrude on the same side with respect to the first linear portion 15 and the second linear portion 18. In addition, the region R1 in which the first bypass portion 16 is provided and the region R2 in which the second bypass portion 19 is provided are at least partially overlapped in the first direction and the second direction. Therefore, the variation of the interval between the first wiring 11 and the second wiring 12 is suppressed, the characteristic impedance is stabilized, and it is possible to maintain quality of data (video information) transferred by the differential transmission line 13.

Furthermore, in the embodiment, as illustrated in FIG. 4, the differential transmission line 13 of the printed wiring board 10 is wired such that the positions of the first linear portions 15A and 15B, and the second linear portions 18A and 18B, the positions of the third linear portion 21 and the sixth linear portion 26, the positions of the fourth linear portion 22 and the first curved portion 25, the positions of the fifth linear portion 23 and the second curved portion 27 correspond to each other in the first direction and the second direction. Therefore, when the whole of the differential transmission line 13 is viewed, it is possible to minimize the variation of the interval S between the first wiring 11 and the second wiring 12.

Although the printed wiring board of the related art can align the wiring length of a pair of wirings, an interval between the pair of wirings is greatly varied and thereby there is a problem that the characteristic impedance is not stabilized. In contrast, according to the printed wiring board 10 of the embodiment, it is possible to align the wiring lengths of a pair of wirings configuring the differential transmission line 13 and to minimize the variation of the characteristic impedance. Therefore, it is possible to provide the printed wiring board in which deterioration of signal quality can be suppressed when transferring a signal such as the video information by the differential transmission line.

Furthermore, in the printed wiring board 10 of the embodiment, it is possible to freely dispose the first bypass portion 16 and the second bypass portion 19 in the linear portions of the first wiring 11 and the second wiring 12. In addition, as illustrated in FIG. 3, the first bypass portion 16 and the second bypass portion 19 slightly protrude from the extension line of the first linear portion 15 and the second linear portion 18, and an area occupied by the first bypass portion 16 and the second bypass portion 19 does not become so large. Therefore, a degree of freedom of design of the differential transmission line 13 is increased and it is possible to contribute to the miniaturization of the printed wiring board 10.

In the embodiment, it is possible to provide the information communication device such as the information transfer device 100 and the projector 500 in which the deterioration of the video information can be suppressed when transmitting and receiving the video information by including the printed wiring board 10 described above. In addition, it is possible to provide the display system 1 which is excellent in the video quality.

Moreover, a technical scope of the invention is not limited to the embodiment described above and may be variously modified without departing from the scope of the invention.

For example, in the embodiment, the second bypass portion 19 is configured of two curved portions and one linear portion, but instead of the configuration, the second bypass portion 19 may be configured of, for example, only an elliptical arc-shaped curved portion. Specific description of the shape, the dimensions, the arrangement, the number of each configuration element configuring the printed wiring board 10, and the like may be appropriately modified. The invention is capable of applying to any of a rigid-type printed wiring board and a flexible printed wiring board.

In addition, in the embodiment, as an example of the transmitter configuring the information communication device, the information transfer device 100 is illustrated and as an example of the receiver configuring the information communication device, the projector 500 is illustrated, but the invention is not limited to the examples. The invention is capable of applying to various information communication devices for transmitting and receiving information such as a mobile phone and a liquid crystal display.

In addition, in the embodiment, the printed wiring boards 10 are provided both the wireless transmission portion 103 of the information transfer device 100 and the wireless receiving portion 503 of the projector 500 in the display system 1, but the invention is not limited to the example. The printed wiring board 10 may be configured to be provided in one of the information transfer device 100 and the projector 500.

In the embodiment described above, a case where the invention is applied to a transmissive type projector is described as an example, but the invention is also capable of applying to a reflection type projector. Here, the "transmissive type" means that the liquid crystal light valve including a liquid crystal panel and the like is a type for transmitting light. The "reflection type" means that the liquid crystal light valve is a type for reflecting light. Moreover, the light modulation device is not limited to the liquid crystal panel and the like, and, for example, may be a light modulation device using, for example, a micro mirror.

In addition, each embodiment described above, an example of the projector 500 using three liquid crystal panels (liquid crystal light valves 560R, 560G, and 560B) is described, but the invention may be also applied to a projector using only one liquid crystal panel or a projector using four or more liquid crystal panels.

The entire disclosure of Japanese Patent Application No. 2016-008501, filed Jan. 20, 2016 is expressly incorporated by reference herein.

What is claimed is:

1. A printed wiring board comprising:
a differential transmission line that has a first wiring and a second wiring,
wherein the first wiring has
a plurality of first linear portions that are formed of a linear wiring and
a first bypass portion that is connected to the plurality of first linear portions and includes a linear wiring extending in a direction intersecting a first direction in which the first linear portions extend,
wherein the second wiring has
a plurality of second linear portions that are formed of a linear wiring and
a second bypass portion that is connected to the plurality of second linear portions and includes a curved wiring extending in a direction intersecting a second direction in which the second linear portions extend,
wherein the first direction and the second direction are substantially parallel,
wherein the first bypass portion and the second bypass portion protrude on the same side with respect to the first linear portions and the second linear portions, and wherein a region in which the first bypass portion is provided and a region in which the second bypass portion is provided are at least partially overlapped in the first direction and the second direction.

2. The printed wiring board according to claim 1, wherein the first bypass portion has
   a third linear portion that is formed of a linear wiring extending in a direction substantially parallel to the first direction,
   a fourth linear portion that connects one end of the third linear portion and one first linear portion, and is formed of a linear wiring extending in a direction intersecting the first direction, and
   a fifth linear portion that connects the other end of the third linear portion and another first linear portion, and is formed of a linear wiring extending in a direction intersecting the first direction.

3. The printed wiring board according to claim 2, wherein an angle between the first linear portion and the fourth linear portion, and an angle between the first linear portion and the fifth linear portion are equal to or greater than 120° and equal to or less than 150°.

4. The printed wiring board according to claim 2, wherein the second bypass portion has
   a sixth linear portion that is formed of a linear wiring extending in a direction substantially parallel to the second direction,
   a first curved portion that connects one end of the sixth linear portion and one second linear portion, and is formed of a curved wiring extending in a direction intersecting the second direction, and
   a second curved portion that connects the other end of the sixth linear portion and another second linear portion, and is formed of a curved wiring extending in a direction intersecting the second direction.

5. The printed wiring board according to claim 4, wherein a first ratio of a distance from a center line of the first linear portion to a center line of the third linear portion with respect to a wiring width of the first linear portion is equal to or greater than 0.5 and equal to or less than 1.0.

6. The printed wiring board according to claim 5, wherein a second ratio of a distance from a center line of the second linear portion to a center line of the sixth linear portion with respect to a wiring width of the second linear portion is equal to or greater than 0.5 and equal to or less than 1.0.

7. The printed wiring board according to claim 6, wherein the first ratio and the second ratio are substantially equal to each other.

8. An information communication device comprising: the printed wiring board according to claim 1.
9. An information communication device comprising: the printed wiring board according to claim 2.
10. An information communication device comprising: the printed wiring board according to claim 3.
11. An information communication device comprising: the printed wiring board according to claim 4.
12. An information communication device comprising: the printed wiring board according to claim 5.
13. An information communication device comprising: the printed wiring board according to claim 6.
14. An information communication device comprising: the printed wiring board according to claim 7.
15. A display system comprising:
    an information transfer device configured to transfer video information; and
    a projector configured to project light based on the video information transferred by the information transfer device,
    wherein at least one of the information transfer device and the projector includes a print wiring board that has a differential transmission line having a first wiring and a second wiring,
    wherein the first wiring has
      a plurality of first linear portions that are formed of a linear wiring and
      a first bypass portion that is connected to the plurality of first linear portions and includes a linear wiring extending in a direction intersecting a first direction in which the first linear portions extend,
    wherein the second wiring has
      a plurality of second linear portions that are formed of a linear wiring and
      a second bypass portion that is connected to the plurality of second linear portions and includes a curved wiring extending in a direction intersecting a second direction in which the second linear portions extend,
    wherein the first direction and the second direction are substantially parallel,
    wherein the first bypass portion and the second bypass portion protrude on the same side with respect to the first linear portions and the second linear portions, and
    wherein a region in which the first bypass portion is provided and a region in which the second bypass portion is provided are at least partially overlapped in the first direction and the second direction.

* * * * *